(12) United States Patent
Hackert et al.

(10) Patent No.: US 10,004,141 B2
(45) Date of Patent: Jun. 19, 2018

(54) KITCHEN APPLIANCE OPERABLE BY ELECTRIC MOTOR, DATA MEMORY ELEMENT, AND COMBINATION OF A KITCHEN APPLIANCE OPERABLE BY ELECTRIC MOTOR AND A DATA MEMORY ELEMENT

(71) Applicant: Vorwerk & Co. Interholding GmbH, Wuppertal (DE)

(72) Inventors: Georg Hackert, Bochum (DE); Carsten Jacobs, Radevormwald (DE); Torsten Lang, Solingen (DE)

(73) Assignee: Vorwerk & Co. Interholding GmbH, Wuppertal (DE)

( * ) Notice: Subject to any disclaimer, the term of this patent is extended or adjusted under 35 U.S.C. 154(b) by 282 days.

(21) Appl. No.: 14/774,661

(22) PCT Filed: Mar. 21, 2014

(86) PCT No.: PCT/EP2014/055710
§ 371 (c)(1),
(2) Date: Sep. 10, 2015

(87) PCT Pub. No.: WO2014/147223
PCT Pub. Date: Sep. 25, 2014

(65) Prior Publication Data
US 2016/0037636 A1    Feb. 4, 2016

(30) Foreign Application Priority Data

Mar. 21, 2013   (DE) .................. 10 2013 102 919

(51) Int. Cl.
*H05K 1/11*    (2006.01)
*H01R 11/30*   (2006.01)
(Continued)

(52) U.S. Cl.
CPC ................ *H05K 1/11* (2013.01); *A47J 36/32* (2013.01); *A47J 43/046* (2013.01); *A47J 43/07* (2013.01);
(Continued)

(58) Field of Classification Search
CPC .... A47J 27/004; A47J 27/2105; A47J 43/046; A47J 43/0727; A47J 43/0766;
(Continued)

(56) References Cited

U.S. PATENT DOCUMENTS 5,784,511 A * 7/1998 Kikuchi ............... G02B 6/3886
                                                  385/53
5,812,356 A * 9/1998 O'Connor ............. G06F 1/1632
                                                  335/179

(Continued)

FOREIGN PATENT DOCUMENTS

CN    202721928 U    2/2013
WO   2008/112066 A1  9/2008

OTHER PUBLICATIONS

International Search Report of PCT/EP2014/055710, dated Jun. 4, 2014.
(Continued)

*Primary Examiner* — Tony G Soohoo
(74) *Attorney, Agent, or Firm* — Collard & Roe, P.C.

(57) ABSTRACT

A kitchen appliance operable by electric motor includes a housing, which has an outer surface, and a data transmission interface designed to interact with a data memory element. The data transmission interface is formed in an outer surface of the housing by metal contact elements, which are arranged adjacent to each other and which each have a contact surface and form part of the outer surface. Further, a data memory element for transmitting data to a kitchen appliance operable by electric motor includes a plurality of (Continued)

contact elements that are separate from each other and optionally a contact surface. Further, a combination of a kitchen appliance operable by electric motor and a data memory element, which can be detachably connected to the kitchen appliance, can transmit data of the data memory element to the kitchen appliance while the data memory element is connected to the kitchen appliance. Further, a combination of a kitchen appliance operable by electric motor and a data memory element, which can be handled as an individual part, can bring the data memory element into contact with the kitchen appliance for data exchange.

20 Claims, 8 Drawing Sheets

(51) Int. Cl.
| | | |
|---|---|---|
| *H01R 13/62* | (2006.01) | |
| *H01R 12/72* | (2011.01) | |
| *H01R 12/73* | (2011.01) | |
| *H01R 24/60* | (2011.01) | |
| *H05K 5/02* | (2006.01) | |
| *G11B 33/12* | (2006.01) | |
| *G06F 1/18* | (2006.01) | |
| *A47J 43/07* | (2006.01) | |
| *A47J 43/046* | (2006.01) | |
| *B01F 15/00* | (2006.01) | |
| *A47J 36/32* | (2006.01) | |

(52) U.S. Cl.
CPC ..... *A47J 43/0727* (2013.01); *B01F 15/00123* (2013.01); *G06F 1/187* (2013.01); *G11B 33/124* (2013.01); *G11B 33/125* (2013.01); *H01R 11/30* (2013.01); *H01R 12/72* (2013.01); *H01R 12/721* (2013.01); *H01R 12/722* (2013.01); *H01R 12/73* (2013.01); *H01R 13/6205* (2013.01); *H01R 24/60* (2013.01); *H05K 5/0217* (2013.01)

(58) Field of Classification Search
CPC . A47J 36/32; A47J 43/07; H05K 1/11; H05K 5/0217; B01F 15/00123; H01R 11/30; H01R 13/6205; H01R 12/722; H01R 12/72; H01R 12/721; H01R 12/73; H01R 24/60; G11B 33/125; G11B 33/124; G06F 1/187
USPC .......................................................... 366/189
See application file for complete search history.

(56) References Cited

U.S. PATENT DOCUMENTS

| | | | | |
|---|---|---|---|---|
| 5,829,341 | A * | 11/1998 | Lin | A21B 7/005 219/400 |
| 5,921,783 | A * | 7/1999 | Fritsch | H01R 13/703 439/38 |
| 6,129,559 | A * | 10/2000 | Hirata | H01L 24/72 174/253 |
| 6,981,887 | B1 * | 1/2006 | Mese | H01R 29/00 439/244 |
| 7,963,773 | B2 * | 6/2011 | Palli | H01R 13/6205 439/38 |
| 8,177,560 | B2 * | 5/2012 | Rohrbach | H01R 13/6205 439/39 |
| 8,348,678 | B2 * | 1/2013 | Hardisty | H01R 13/6205 439/39 |
| 8,596,881 | B2 * | 12/2013 | Umeno | G02B 6/3817 385/53 |
| 8,963,666 | B2 * | 2/2015 | Bilbrey | H01R 13/641 335/207 |
| 9,197,010 | B2 * | 11/2015 | Greig | H01R 13/6205 |
| 9,665,125 | B2 * | 5/2017 | Browning | G06F 1/1632 |
| 2002/0009017 | A1 * | 1/2002 | Kolar | A47J 27/62 366/206 |
| 2007/0072443 | A1 * | 3/2007 | Rohrbach | H01R 13/6205 439/39 |
| 2008/0223854 | A1 | 9/2008 | Zeijlon | |
| 2008/0225636 | A1 * | 9/2008 | Kolar | A47J 43/07 366/206 |
| 2012/0021619 | A1 * | 1/2012 | Bilbrey | H01R 13/6205 439/39 |
| 2012/0148195 | A1 * | 6/2012 | Umeno | G02B 6/3817 385/53 |
| 2012/0200173 | A1 * | 8/2012 | Liu | G06F 1/1613 307/116 |
| 2013/0003490 | A1 * | 1/2013 | Kemker | A47J 27/62 366/142 |
| 2014/0313665 | A1 * | 10/2014 | Delpier | G06F 1/1616 361/679.55 |
| 2016/0037636 | A1 * | 2/2016 | Hackert | A47J 43/046 361/679.31 |
| 2017/0264046 | A1 * | 9/2017 | Szeto | H01R 11/30 |

OTHER PUBLICATIONS

Response of German Attorney to European Patent Office in PCT/EP2014/055710, dated Jan. 9, 2015, with English translation of relevant parts.

* cited by examiner

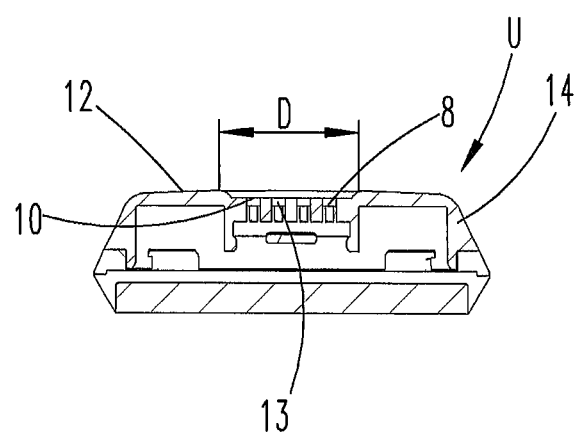

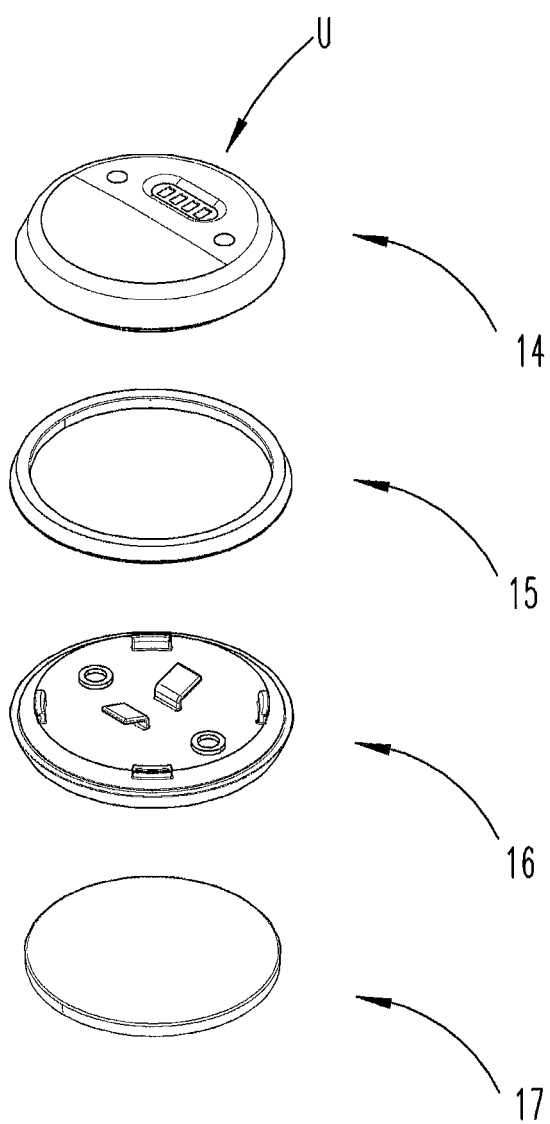

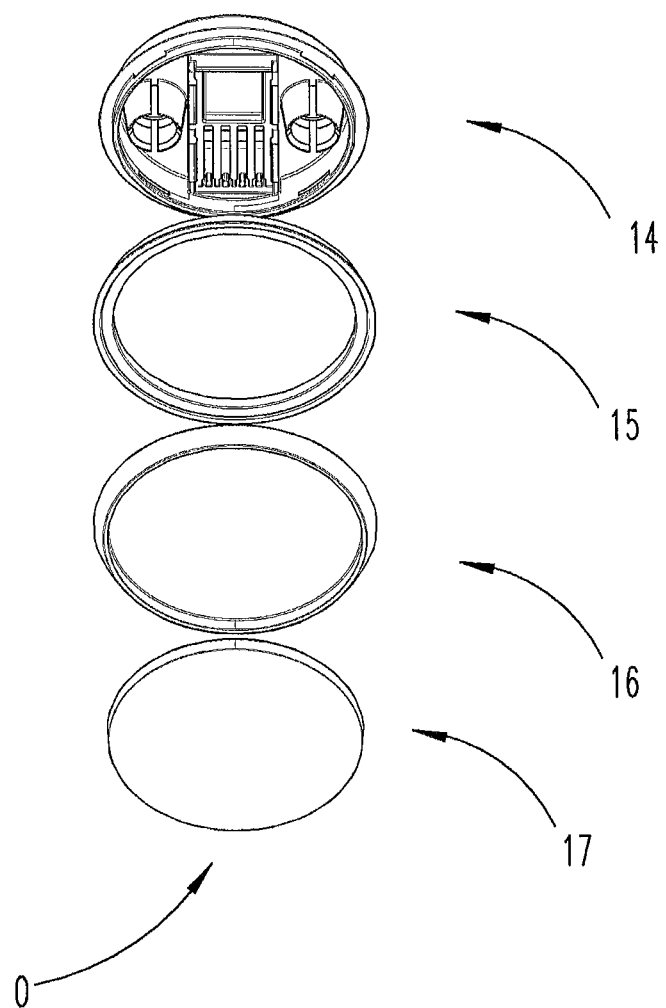

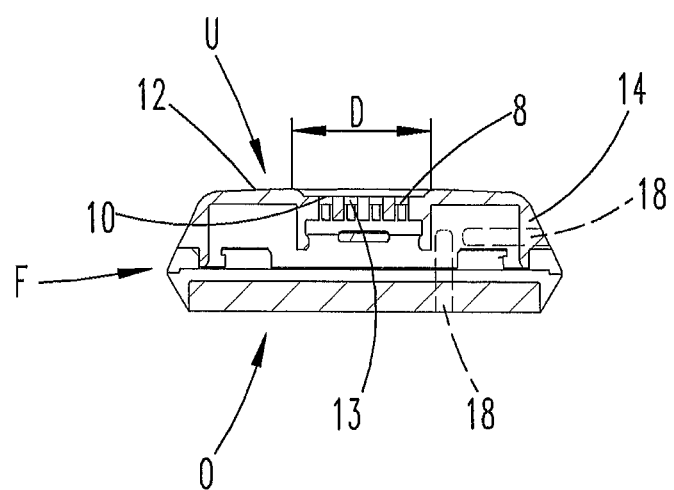

KITCHEN APPLIANCE OPERABLE BY ELECTRIC MOTOR, DATA MEMORY ELEMENT, AND COMBINATION OF A KITCHEN APPLIANCE OPERABLE BY ELECTRIC MOTOR AND A DATA MEMORY ELEMENT

CROSS REFERENCE TO RELATED APPLICATIONS

This application is the National Stage of PCT/EP2014/055710 filed on Mar. 21, 2014, which claims priority under 35 U.S.C. § 119 of German Application No. 10 2013 102 919.1 filed on Mar. 21, 2013, the disclosure of which is incorporated by reference. The international application under PCT article 21(2) was not published in English.

To begin with, the invention relates to a kitchen appliance operable by electric motor, comprising a housing, which has an outer surface and comprising a data transmission interface designed to interact with a data memory element.

The invention further relates to a data memory element for transmitting data to a kitchen appliance operable by electric motor, comprising a plurality of contact surfaces that are separate from each other.

The invention also relates to a combination of a kitchen appliance operable by electric motor comprising a data memory element, which can be detachably connected to the kitchen appliance and the data of which can be transmitted to the kitchen appliance while the data memory element is connected to the kitchen appliance, wherein the kitchen appliance comprises a housing, which has an outer surface, and comprising a data transmission interface designed to interact with the data memory element.

It is generally known to transmit data to machines, often by means of a data transmission interface, which is designed as USB interface. These interfaces require a hole-like design, which reaches into the interior of a machine or of a device. With regard to a kitchen appliance, said interfaces are associated with disadvantages, because a contamination can result and because a hole-like design, as necessary insertion opening, can clog.

A data memory element or a kitchen appliance comprising a data memory element, respectively, is known from US 2002/0009017 A1, wherein the data memory element is designed as rectangular flat part. The flat part as a whole is designed in a cuboid-shaped manner, comprising straight side edges. While being plugged into the kitchen appliance, the data memory element is arranged on the bottom side of the kitchen appliance.

US 2008/0223854 A1 shows a common button design. Provision is made for lateral contact elements.

Based on a prior art according to US 2002/0009017 A1, the invention deals with the object of specifying a kitchen appliance operable by electric motor comprising a favorable data transmission interface, furthermore a data memory element, which is designed in a favorable manner in particular with regard to handling requirements, in particular with regard to kitchen appliances, and a combination of a kitchen appliance operable by electric motor comprising a data memory element, which can interact in a favorable manner.

A possible solution of the object with regard to the kitchen appliance operable by electric motor is initially and substantially provided in that the data transmission interface is formed in an outer surface of the housing by metal contact elements, which are arranged adjacent to each other and which each have a contact surface and form part of the outer surface. The contact surfaces, which represent a part of the outer surface, make it unnecessary to provide hole-like plug-in openings, which project into the interior of the kitchen appliance. With regard to a kitchen appliance, a good cleanability also results accordingly for such a part of the outer surface. The contact elements are arranged adjacent to each other so as to be integrated in the outer surface. Preferably, the embodiment is such that all of the contact surfaces are illustrated adjacent to each other when the outer surface projects into a vertical or horizontal plane, based on a common placement of the kitchen appliance, as well as in a top view or side view, prepared according to drawing rules, of a kitchen appliance with regard to the common placement thereof on a flat ground.

In its technical function, the data transmission interface preferably corresponds to a common interface, as it is known for USB sticks, for example on the device side.

With regard to a data memory element, a possible solution of the object is initially and substantially provided in that the contact elements, which each have a contact surface, each form part of the bearing surface and that one or a plurality of magnets also act in the bearing surface, separate from the contact elements, or that one or a plurality of magnetizable areas are embodied. It is also provided hereby that the contact elements, based on an illustration of the bottom side according to the mentioned drawing rules, are illustrated adjacent to each other. With regard to the plane, onto which a projection is made mentally, the bottom side is hereby oriented such that the contact elements, which are preferably also arranged in a common plane, are located in a plane, which is offset in parallel, in the surface extension thereof. It is obvious that a geometrically completely exact orientation, even if it is preferred, is not important for the clarification of the adjacent arrangement, which is the primary aim herein.

It is thus attained that the data memory element has a bearing surface, which matches the outer surface of the kitchen appliance, for example, which, in flat contact with the outer surface of the device, to which data are to be transmitted, can bear on directly. Due to the fact that one or a plurality of magnets or magnetizable areas are embodied, a favorable holding possibility of the data memory element is simultaneously also provided as a combination therein.

A solution is also provided in that, in the cross section, the bottom side of the data memory element transitions into a wall contour, which extends at an obtuse angle to the contour line of the bottom side, and in that, on the edge side in the cross section, the upper side also transitions into a wall contour, which extends downwards and which runs at an obtuse angle to the contour line of the upper side, wherein a circumferential edge for seizing the data memory element results when the two wall contour lines meet.

In its technical function, such a data memory element is preferably also designed according to a common USB stick. It can also have additional functions, such as an encrypting device, in particular by means of a cryptographic memory, which is provided in the data memory element for this purpose. Provision can also be made for components for embodying radio transmission options for data transmission to the data memory element, such as those, which are required for transmitting according to the UMTS standard.

With regard to a combination of a kitchen appliance operable by electric motor and a data memory element, which can be detachably connected to the kitchen appliance, a further possible solution of the object is initially and substantially provided in that the data transmission interface is formed in the outer surface of the housing of the kitchen appliance by metal contact elements, which are arranged adjacent to each other and which each have a contact surface and herewith form part of the outer surface and that the data memory element has a bearing surface, which serves to bear flat against the data transmission interface of the kitchen appliance and which is adapted thereto. Separate from the contact elements, one or a plurality of magnets can also act in the bearing surface, or one or a plurality of magnetizable elements can be embodied therein. One or a plurality of magnets can also act in the outer surface of the kitchen appliance, assigned to the data transmission interface, for interacting with the magnetizable elements of the data memory element while connected to said data memory element, or provision can be made in the outer surface, assigned to the data transmission interface, for one or a plurality of magnetizable elements for interacting with magnets of the data memory element while connected to said data memory element.

A favorable data transmission interface, which is integrated in the kitchen appliance, combined with a data memory element adapted thereto is thus created. A simple connection and separation of the kitchen appliance and of the data memory element can additionally be attained by means of magnetic adhesion.

A further possible solution of the object with regard to the combination of the kitchen appliance with the data memory element is also provided in that the data memory element is designed as flat part comprising a bottom side and an upper side, comprising a largest layout dimension of the bottom side or of the upper side, respectively, which corresponds to 1.5-times or more of the largest thickness of the data memory element, up to 10-times or 20-times, for example, wherein contact elements in the kitchen appliance are referred to as first contact elements, and contact elements of the data memory element are referred to as second contact elements, and the second contact elements are arranged in the bottom side of the data memory element and that only the upper side is visible when the data memory element interacts with the kitchen appliance for data transmission in a view cone comprising a cone angle of 60° or less, based on a cone axis vertically to a center plane of the data memory element and permeating the area center. The design of the data memory element as flat part is used to arrange the data memory element in a quasi-integrating manner in the outer surface of the kitchen appliance while transmitting data. Even though the data memory element can represent a certain elevation as compared to a surrounding outer surface of the housing in the area of the data transmission interface of the kitchen appliance, an orientation of the upper side, however, is adapted to the orientation of the surrounding housing surface.

With regard to the kitchen appliance, it is preferred for the data transmission interface to be embodied in a partial outer surface, which is shifted back as compared to the surrounding outer surface of the kitchen appliance. It is offset towards the interior of the kitchen appliance. By means of the formed partial outer, surface and the shift-back thereof, a receiving trough is preferably formed at the same time for the data memory element or for at least a part of the data memory element. The receiving trough can contribute favorably towards the holding of the data memory element while it is connected to the kitchen appliance. While being connected to the kitchen appliance, the upper side of the data memory element is flush with the surrounding outer surface of the kitchen appliance and rises above it.

The receiving trough has a trough bottom. An extension of the trough bottom is preferably adapted to the extension of the surrounding outer surface of the kitchen appliance. In this regard, this is quasi a flat area of the outer surface, which is offset towards the interior of the kitchen appliance.

The trough can be formed such that, when received, the data memory element is simultaneously held by a trough wall alone, at least to the extent that a freedom of vibrations does not have the result that the data memory element drops or falls out of the trough, even if the partial outer surface is formed vertically or at an acute angle to a vertical (in turn based on a common placement situation of the kitchen appliance on flat ground).

It is preferred, however, for the data memory element not to be held in the trough without additional measures, as will be explained in more detail below, at least in response to the vertical or nearly vertical orientation of said trough with regard to the partial outer surface, thus that a data transmission cannot take place.

The size of the trough with regard to the surface extension thereof can preferably be provided such that one or a plurality of fingers, which are covered with a cleaning cloth, for example, can move across the partial outer surface for cleaning. As compared to a mental continuation of the surrounding outer surface of the shift-back, in its lowest area, is preferably a few millimeters, for example 3 to 20 mm.

The data memory element can preferably have a design, which is geometrically adapted to the trough, relative to the area, which is immersed in the trough while in contact, so that a contact to the through wall follows substantially across the entire surface of the data memory element, which is immersed in the trough while in contact. The area, which is immersed in the trough while in contact, is preferably provided only by the bottom side of the data memory element. The bottom side can hereby be immersed completely, partially or preferably at least for the most part in the trough while in contact.

On the edge side, the cross section of the bottom side merges into a wall contour, which extends at right angles or at an obtuse angle of 91 to 160°, for example, to the contour line of the upper side, at least the section of the contour line, which is assigned to the edge area. On the edge side, in the mentioned cross section, the upper side also merges into a wall contour, which extends downwards and which runs in the same manner, at right angles or at an obtuse angle, for example 91 to 160°, to the contour line of the upper side, at least in the area which is assigned to the edge. Accordingly, this leads to a circumferential edge, which is advantageous for seizing the data memory element, when the two wall contour lines meet, when the mentioned obtuse angle is realized. With regard to a thickness of the data memory element, measured in the cross section between the bottom side and the upper side, the edge is arranged eccentrically, namely preferably offset towards the upper side.

Based on a cross section, the trough can have trough walls, which extend outwards from the trough bottom, to the transition into the surrounding outer surface of the housing. It can be a trough wall, which is circumferential and which is preferably designed so as to be closed. Based on the cross section, the extension of a trough wall can preferably draw an obtuse angle with the trough bottom, more preferably between 91 and 160°.

Independent from or in addition to the above, the data memory element can also be characterized in that it is designed as flat part comprising a bottom side and an upper side, comprising a largest layout dimension of the bottom side or of the upper side, respectively, which corresponds to 1.5-times or more, up to 10-times or 20-times of a largest thickness of the data memory element and that the contact elements are arranged in one of the sides, in the bottom side.

Accordingly, the lower side is the side, which rests directly on a corresponding surface, preferably the mentioned partial outer surface while interacting with the kitchen appliance. The flat design, preferably also with a rounded or more preferably with a circular layout, with the arrangement of the contact elements in one of the flat sides provides for a handling by simple placing the comparatively large bottom side onto the corresponding bearing surface, in particular the partial outer surface of the kitchen appliance. A plug-in operation does not need to be made.

With regard to the kitchen appliance operable by electric motor, provision is preferably made in a further embodiment for the partial outer surface to be embodied so as to be closed. This is in particular a partial outer surface, which is free from openings and holes.

The partial outer surface can in particular have a certain elevation or depression in the area of the metal contact elements. The metal contact elements can hereby rise beyond a surrounding area of the partial outer surface (optionally also to be referred to as trough bottom) outwards by a measure, which corresponds to the largest extension thereof, or less, or can be shifted back by such a measure relative to the plane or the area surrounding the metal contact elements, respectively (optionally also to be referred to as trough bottom). Absolutely, the measure can be between 0.5 and 5 mm, for example. In the case of an elevation, however, this measure is preferably lower than corresponds to an absolute (inwards) shifting of the partial outer surface.

The metal contact elements are preferably arranged so as to be combined in a rib-like elevation of the trough bottom.

They can also extend in the plane of the partial outer surface or at least of the directly surrounding area, respectively (in the case of the mentioned rib formation, for instance).

In detail, provision can be made for three or more metal contact elements. It is also preferred hereby for these metal contact elements to be arranged along a straight line. This can be provided accordingly at the kitchen appliance as well as at the data memory element. Preferably, the embodiments relating to the contact elements, the bearing surface and/or the trough are already provided in a quasi mirror-inverted manner at the kitchen appliance or the data memory element, respectively.

The partial outer surface has an area center, which is also identified as geometric center of gravity. In the case of a circular partial outer surface, the layout of which is defined accordingly by means of a circular line, the area center is the center point of said circle.

With regard to such an area center, it is preferred for the metal contact elements to be arranged outside of the area center. In the case of a circular layout contour, the metal contact elements can be arranged on a secant to the line forming the respective circular area.

The partial outer surface preferably has at least one layout contour having curves. As noted, said partial outer area can specifically be circular or oval, for example.

As compared to the total outer surface of the kitchen appliance or a side of the kitchen appliance, respectively, in which it is integrated, the partial outer surface can be comparatively small. In absolute terms, the partial outer surface can have a dimension, in the case of which a largest liner extension, optionally a diameter dimension, within the layout contour is between 1 and 10 cm.

More preferably, provision is made for one or a plurality of magnets or magnetizable areas, which are effective in the outer surface or in the partial outer surface. A magnet or magnetizable area can be provided so as to be laterally offset to a metal contact element. Preferably, they are offset laterally to an imaginary connecting line of the contact elements towards the interior of the surface or towards the area center of the partial outer surface, respectively. In particular, it is preferred for a magnet or a magnetizable area to be arranged below the partial outer surface, but acting therein, more preferably such that it is not visible from outside. While the partial outer surface as well as the outer surface of the kitchen appliance is preferably made of plastic apart from that or at least substantially apart from that, it goes without saying that the magnet or the magnetizable area is designed so as to be metallic.

In particular, it is preferred for provision to be made for two magnets or for two magnetizable areas.

A distance between the magnets or the magnetizable areas is preferably larger than a distance between two outermost metal contact elements, which are arranged adjacent to each other. In particular, the magnets or magnetizable areas are arranged close to or partially coinciding with a layout contour of the partial outer surface. With regard to a data memory element, which can be arranged herein, a largest possible "lever effect" for orienting the data memory element in response to insertion thus follows, based on the total surface.

In a cross section, the partial outer surface preferably has a planar bottom area and rising edge areas, wherein the edge areas are more preferably designed so as to follow a line of curvature, for example a partial circular line. The transition into the surrounding outer surface of the kitchen appliance is also designed so as to preferably be rounded.

With regard to the data memory element, it is further preferred for the surrounding bearing surface, in which the contact surfaces are embodied, to practically have the same height as the contact surfaces. Individually, the contact surfaces can also be arranged so as to be slightly offset, preferably in terms of a depression, relative to the surrounding contact surface. The absolute measure of the countersink can hereby correspond to approximately 0.5 to 5 mm.

With regard to the bearing surface, which is also identified as bottom side in the context of the instant application, the data memory element itself preferably has a rounded contour, for example a circular or oval-shaped contour. The bearing surface, optionally with the exception of the contact elements, is hereby designed so as to be planar, provided that it is designed so as to be raised or counter-sunk as compared to the bearing surface in the manner described, comprising an edge area, which has a rounded cross section, namely such that the planar area of the bearing surface protrudes. The dimensions of the bearing surface correspond to the above-specified dimensions of the partial outer surface. Preferably, the data memory element is significantly larger in extension direction of the bearing surface than at right angles thereto. More preferably, it is designed as discus-like body, wherein this term does not necessarily specify a circular layout contour. The largest thickness of the data memory element preferably corresponds to between a third and a twentieth of the largest linear extension, based on a layout contour of the data memory element, in the case of which a state is assumed, in response to which the data memory element is assumed so as to bear on the bearing surface on a flat ground.

The data memory element can have a non-volatile memory. It can furthermore have a cryptographic memory.

It can furthermore have elements for the wireless data transmission, for example radio transmission, thus for example elements, as they are required for a UMTS reception.

Preferably, the data memory element furthermore has a handle molding. The handle molding can consist of a handle appendage, which is embodied on one side, in terms of the above explanations on the upper side, and which projects substantially vertically, for instance in terms of a handle molding at a die. It is preferred, however, for the handle molding to result from an edge contour of the data memory element. For this purpose, the bottom side is designed such that the edge contour, which is provided by the transition of the bottom side into the upper side, projects beyond the outer surface of the kitchen appliance while the data memory element interacts with the kitchen appliance, so that the data memory element can be seized for this purpose.

It is furthermore important that a catch effect of the data memory element results on the outer surface, in particular in the trough, due to the offset arrangement of the magnets/magnetizable areas relative to the contact elements, in particular relative to the contact elements, which are individually arranged in a raised or countersunk area, respectively, so that, for joining data memory element and kitchen appliance with regard to a data exchange, a user only needs to make a rough pre-orientation of the data memory element relative to the outer surface or to the partial outer surface, respectively, of the kitchen appliance, and the data memory element then maneuvers on its own into the actual contact position by means of the magnetic effect on the one hand and by means of a centering insertion of the rib-like projection into the corresponding recess on the other hand. For this purpose, it is also preferred for said rib-like projection or the corresponding recess, respectively, on the kitchen appliance or in the data memory element, respectively, to have transitions having a rounded cross section, comprising an obtuse angle between the directly surrounding outer surface (partial outer surface) and a cross sectional course of the wall of the rib-like projection (analogously in the case of the recess). The obtuse angle can be between 91 and 160°. With regard to the rib-like projection and the recess, such an angle is preferably embodied at the rising surfaces on the longitudinal edge side of the rib-like projection as well as at the front surfaces of the rib-like projection.

Due to the arrangement of the magnets or of the magnetizable areas, respectively, on the one hand, the surface of which is offset, and the rib-like projection or the corresponding depression, on the other hand, a certain adaptor lever effect, which then automatically pulls or moves, respectively, the data memory element into the finally accurate contact position, results in response to undirected attachment of the data memory element to the corresponding area of the kitchen appliance.

With the exception of the described contact elements, which are arranged adjacent to each other and which each form part of the outer surface, the data memory element preferably does not have any further contact elements, which are located in the outer surface or which start at the outer surface (for instance common USB interfaces, which will be described below).

With regard to the data memory element, however, provision can also be made for it to have contact elements of a common USB interface as further contact elements, in addition to the described contact elements, which are arranged in the outer surface—in one of the shown embodiments. Such a USB interface is oriented into the interior of the data memory element in a hole-like manner. The common USB interface, which is optionally provided in this manner, can be embodied in a side surface. The side surface is hereby the surface embodied between the planes of the bottom side and upper side. With regard to the design of the data memory element, which preferably has a circular layout, this USB interface can accordingly be provided at nearly any location on the circumference. Provision can also be made for a plurality of such common USB interfaces in the mentioned side surface, for example.

In addition, this USB interface, oriented into the interior of the data memory element, can also be provided starting at the upper and/or bottom side. On principle, a plurality of common USB interfaces can also be embodied in this manner.

To keep a contamination problem as small as possible, such a common USB interface can be provided with a locking piece, for instance a locking piece, which is designed in a plug-like manner. More preferably, also comprising a locking piece, which can (only) be opened by means of a separate tool.

In the selected operating state, for example in particular when the data memory element is not connected to the kitchen appliance, such a common USB interface can serve the purpose of connecting said data memory element to a common computer, for instance a stationary computer or portable computer or a tablet computer, for transmitting data.

In more detail, the mentioned common USB interface can be a standard USB interface. The interface USB 2.0 Standard-A, the interface USB 3.0 Standard-A, the interface 3.0 Powered-B, the interface UBS 3.0 Standard-B, the interface USB 2.0 Standard-B, the interface USB 2.0 Mini-B, the interface USB 3.0 Micro-AB, the interface USB 2.0 Micro-AB, the interface USB 3.0 Micro-B, the interface USB 2.0 Micro-B, etc. are known for this, for example.

With regard to the combination of the kitchen appliance operable by electric motor comprising the data memory element, it is preferred for the kitchen appliance and/or the data memory element to be designed with one or a plurality of the above features, which are explained in this regard.

With regard to the disclosure, the ranges or ranges of values, respectively, or multiple ranges specified above and below also include all intermediate values, in particular in 1/10 steps of the respective dimension, optionally also without dimension; for example, one step is a tenth of a length, width, etc. or of an x-th, when, as a further example, a range (for a length) is specified with a threefold to fivefold (of a width), the 3.1-fold to 5-fold, the 3-fold to 4.9-fold, the 3.1-fold to 4.9-fold, the 3.2-fold to 5-fold, etc. is also disclosed, that is, for limiting the mentioned range boundaries from the bottom and/or the top, on the one hand, yet in the alternative or in addition to the disclosure of one or a plurality of singular values from a respectively specified range. With regard to a range of between 0.5 and 5 mm (length, width, etc.), for example, between 0.6 and 5 mm, between 0.6 and 4.9 mm, between 0.5 and 4.9 mm, etc. is then also disclosed. With regard to an angular range of between 91 and 160°, for example, a range of between 91.1 and 160°, between 91 and 159.9°, between 91.1 and 159.9°, etc., is thus also disclosed, as well as corresponding individual values as range boundaries or within the range.

The invention will furthermore be explained below by means of the enclosed drawing, which, however, represents only an exemplary embodiment:

FIG. 6 shows a cross sectional illustration of the data memory element, cut along the line VI-VI in FIG. 5;

FIG. 7 shows an exploded illustration of the data memory element, viewed diagonally from the top;

FIG. 8 shows an exposed illustration of the data memory element, viewed diagonally from the bottom; and FIG. 9 shows an illustration of the data memory element according to FIG. 6, comprising one or a plurality of suggested additional common USB interfaces.

What is illustrated and described is a kitchen appliance 1 operable by a non-illustrated electric motor, which is located within the kitchen appliance 1. The kitchen appliance 1 furthermore has a mixing bowl 2, which can be accommodated therein and which is accommodated in the illustration of FIG. 1, and a control panel 3.

Provision is furthermore made in the kitchen appliance 1 for a control device for a mixer, which can operated within the mixing bowl 2, and preferably for a heating device for heating the mixing bowl 2.

Figure 1:
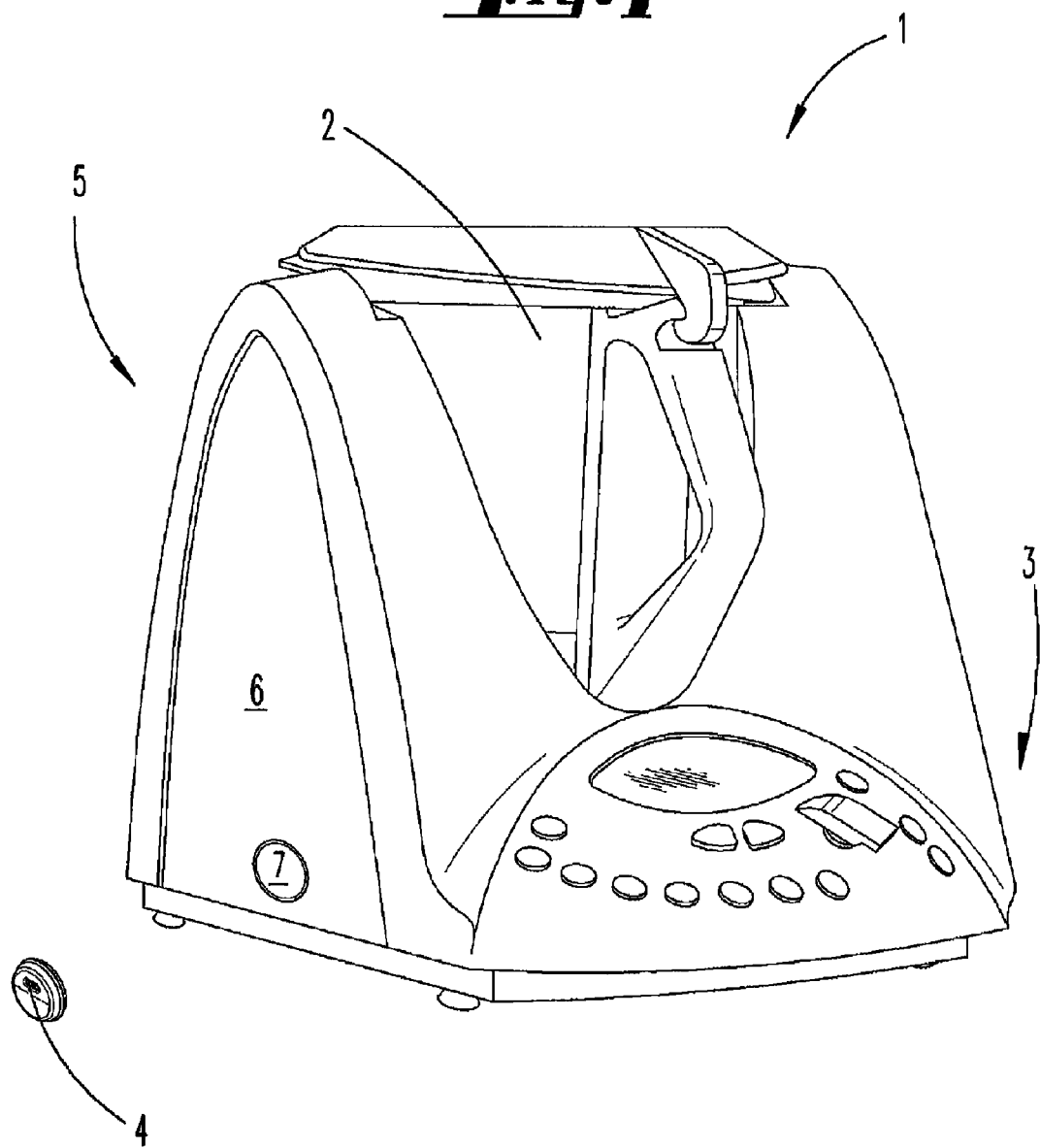
FIG. 1 shows a perspective general view of a kitchen appliance comprising assigned data memory element.

The kitchen appliance furthermore encompasses a data memory and a microprocessor. In addition, provision is preferably also made for a further data memory for accommodating data, which can be input via a data memory element. The data memory element 4 can be held at the kitchen appliance 1 so as to be capable of being detached. FIG. 1 illustrates the data memory element 4, detached from the kitchen appliance and viewed onto the surface, which will be referred to as bottom side hereinbelow. Initially, a data transmission from the data memory element 4 is preferably provided in the mentioned further data memory of the kitchen appliance. In addition or in the alternative also in the data memory, which is mentioned initially and which is already present in the kitchen appliance.

In detail, the kitchen appliance 1 has a housing 5, comprising an outer surface 6. In further detail, four outer surfaces 6, which are to be differentiated, result in the case of a strict observation of the kitchen appliance from the front, the rear and from the side. A partial outer surface 7 is embodied in one of the outer surfaces 6, here preferably a side outer surface. The partial outer surface 7 represents an area, which is offset towards the interior of the kitchen appliance 1 as compared to the surrounding outer surface 6. As can be seen, the partial outer surface 7 is small as compared to the surrounding outer surface 6. It corresponds to less than half of, preferably less than a third of, more preferably less than a tenth of the surrounding outer surface 6, hereby based on a side surface in the mentioned context, for example up to a fiftieth.

A side outer surface of the kitchen appliance is in particular a surface, which can be projected onto an imaginary vertical surface with regard to a view, which is prepared according to common drawing rules, as described above. With regard to an upper side of a kitchen appliance, it is accordingly an (imaginary) horizontal surface, which is located thereabove.

Figure 2:
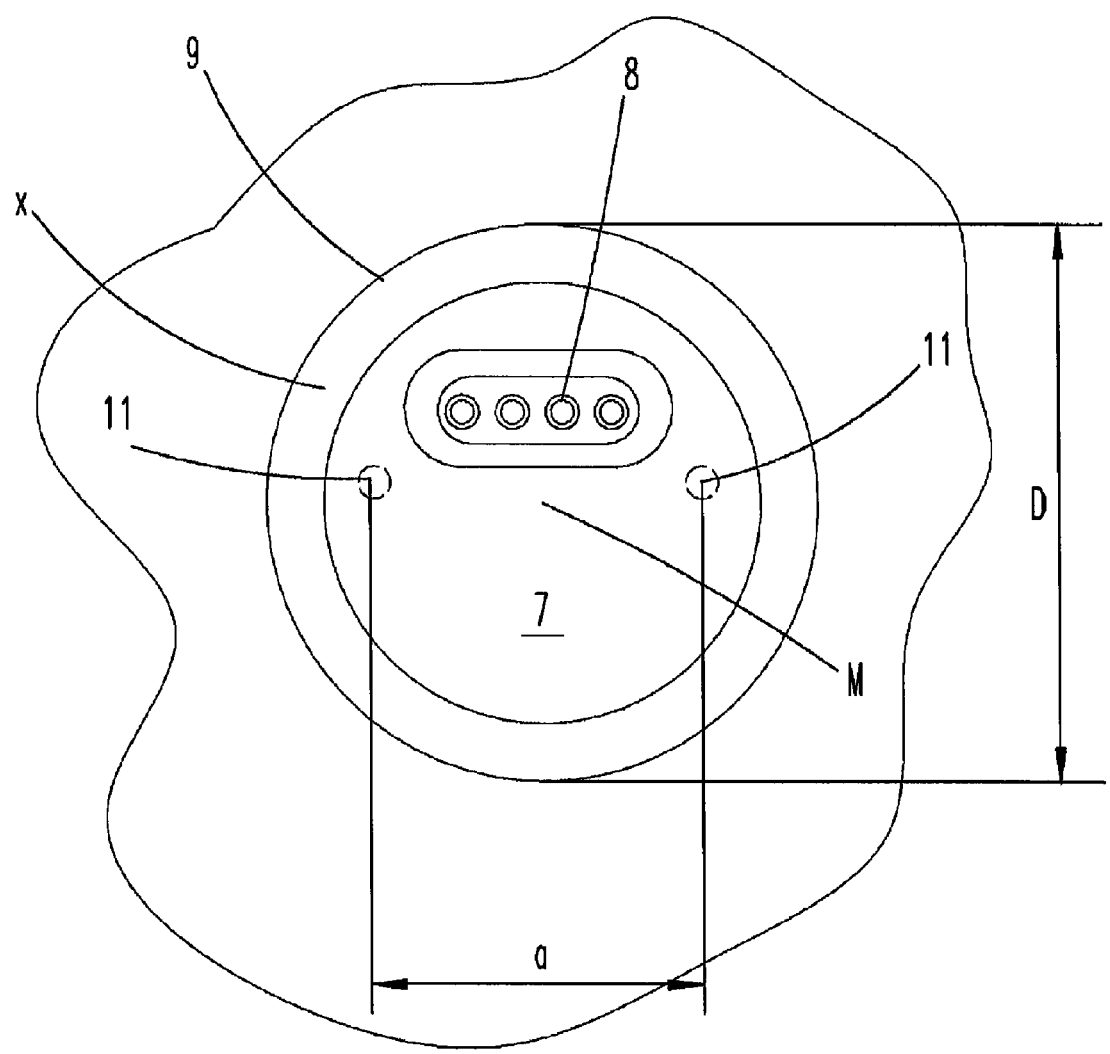
FIG. 2 shows the area of the partial outer surface in enlargement.

With the exception of a transition area x into the surrounding outer surface 6, the partial outer surface 7 is embodied in a planar manner. Metal contact elements 8 can hereby form a further exception, see FIG. 2 or FIG. 3, respectively. The partial outer surface 7 is shifted back as compared to the mentioned outer surface 6 of the kitchen appliance. Within the partial outer surface 7, the metal contact elements 8 form an area of this partial outer surface.

The partial outer surface 7 is preferably embodied as closed area. This follows in the case of the exemplary embodiment in particular by an edge contour line 9, which runs in a closed manner. The edge contour line 9 does not necessarily need to correspond to an actual edge in the housing. Preferably, it is formed by an edge. For instance, it can also be provided by a rounded transition (in cross section) into the surrounding outer surface 6, thus corresponding to an exposed edge.

Figure 3:
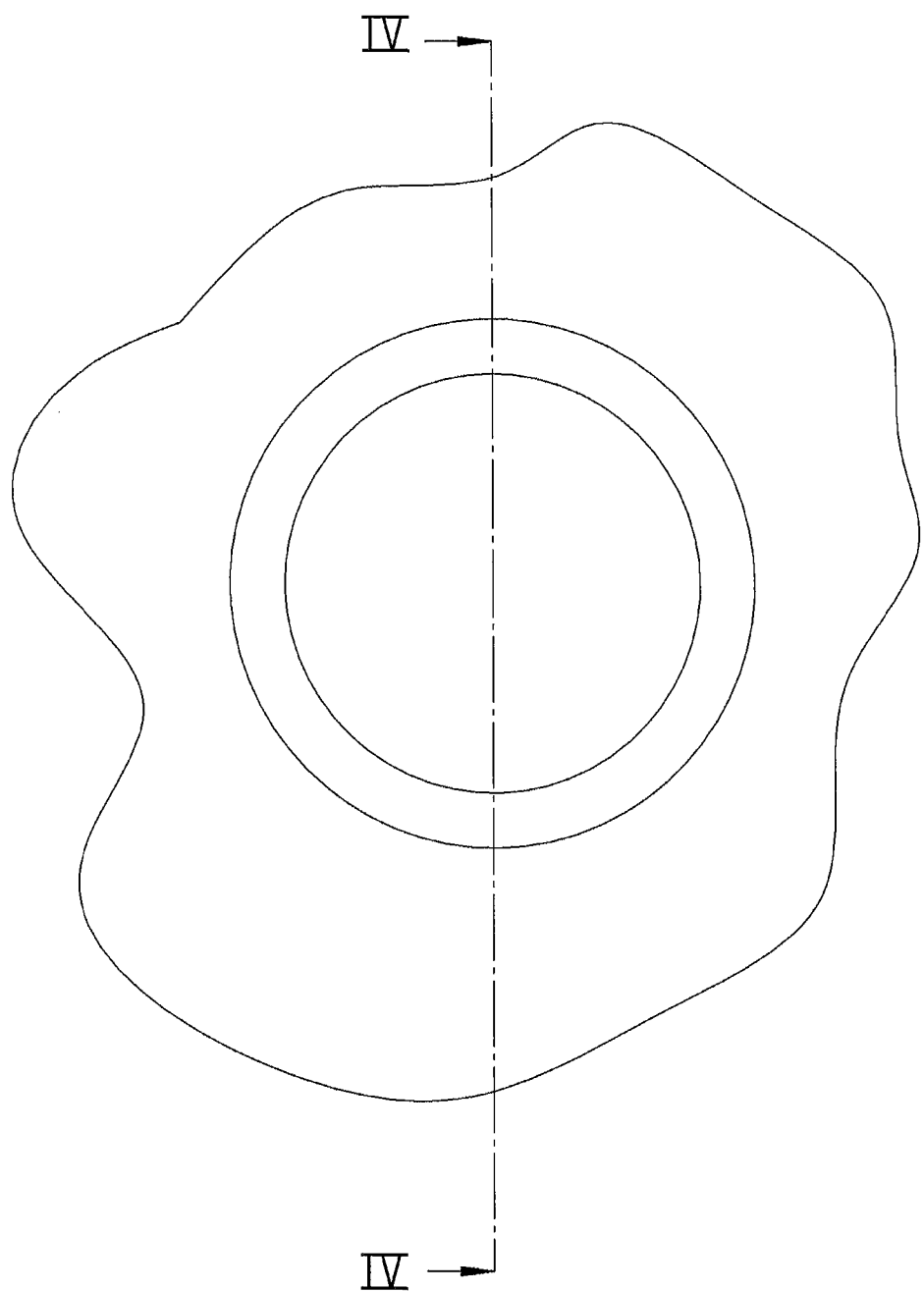
FIG. 3 shows an illustration according to FIG. 2, comprising inserted data memory element.

More preferably, as also follows in particular from the cross sectional illustration of FIG. 3, the partial outer surface 7 is embodied so as to be closed in a depth direction, towards the interior of the kitchen appliance. It does not have any apertures, openings or depressions towards the interior of the kitchen appliance. It thus represents a substantially smooth, easily cleanable surface. This is also not precluded when the contact elements, as will be explained in more detail below, are arranged so as to be slightly lifted or lowered again as compared thereto.

Even though the metal contact elements 8 are arranged within the depression of the partial outer surface 7, they are preferably arranged so as to be slightly elevated as compared to the planar bottom 10 of the partial outer surface 7, which can also be referred to as trough bottom.

They can also be arranged at the same level or slightly countersunk relative to the bottom 10, as explained above. The elevation is preferably (only) such that even though said contact elements extend elevated relative to the surrounding area of the bottom 10, they extend below the edge contour line 9 or below a surrounding surface area f of the outer surface 6, respectively. In a further detail, the elevation is formed in a rib-like manner. The contact surfaces form partial areas of a front surface of such a rib-like elevation.

As a whole, provision is preferably made for a total of four metal contact elements 8, which are preferably also arranged on a straight line adjacent to each other.

With regard to its edge contour, the partial outer surface is formed in a circular manner in the case of the exemplary embodiment, comprising an area center M. In the case of the exemplary embodiment, a diameter D corresponds to approximately 4 cm.

Magnets 11 or magnetizable areas, which, however, are arranged below the bottom 10 and so as preferably not visible from the outside, are furthermore assigned to the bottom 10 of the partial outer surface 7.

If provision is made for corresponding magnets in the data memory element, these magnets 11 or magnetizable areas serve to orient and hold the data memory element while it is connected to the kitchen appliance.

A distance a between the magnets 11 is preferably larger than a distance between two of the outermost metal contact elements 8, four contact elements in the case of the exemplary embodiment, which are arranged adjacent to each other.

Preferably, the magnets 11 or corresponding magnetizable areas, respectively, are in each case arranged close to the edge contour of the partial outer surface 7.

The magnets 11 or magnetizable areas and the contact elements are also located in a surface area, which corresponds to half of or less than the total surface of the partial outer surface 7, preferably so as to be combined.

Figure 4:
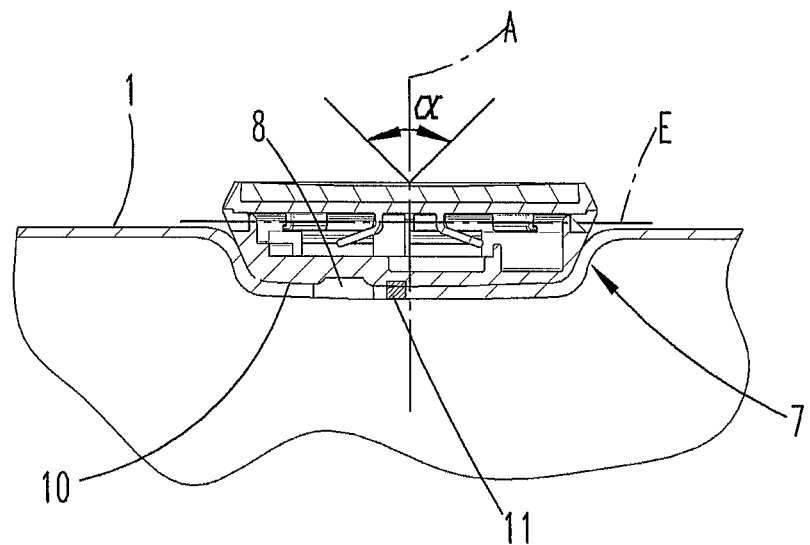
FIG. 4 shows a cross section through the kitchen appliance, cut along the line IV-IV in FIG. 3.
Figure 5:
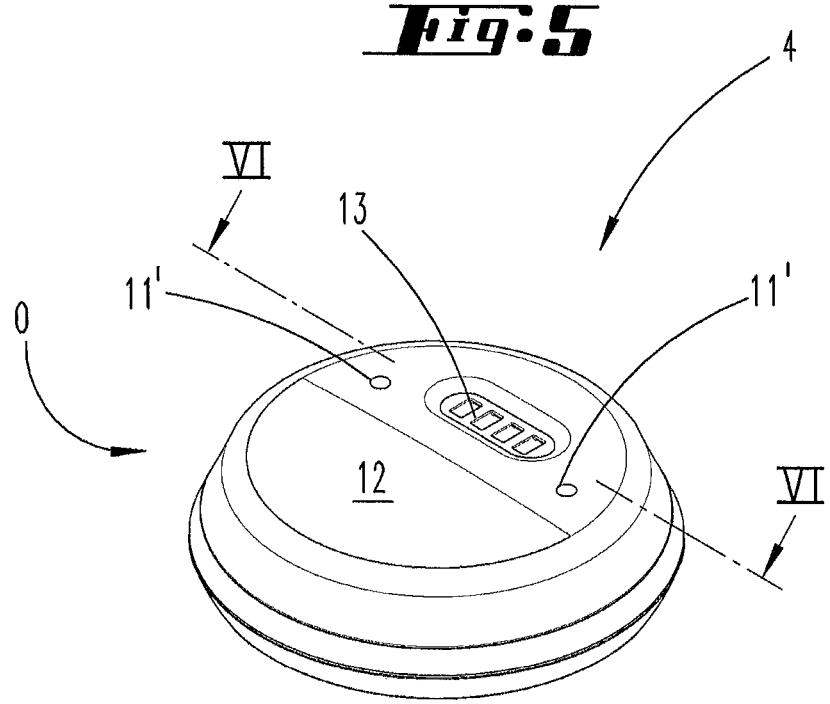
FIG. 5 shows a perspective view of the data memory element, viewed onto the bottom side.

The data memory element 4 is illustrated in a further detail in FIGS. 4 to 6.

With reference to FIGS. 5 and 7, 8, it can be seen that, in the case of the exemplary embodiment, said data memory element has a circular layout, but which can also be formed in an oval-shaped manner or irregularly rounded, for example, with regard to the contour, optionally comprising straight intermediate sections.

From the upper side in FIG. 5, also referred to as bottom side above, the data memory element 4 has a bearing surface 12, by means of which it rests against the partial outer surface 7 while connected to the kitchen appliance 1. A plurality of contact surfaces 13, in the case of the exemplary embodiment four contact surfaces 13, which are arranged adjacent to each other, are embodied in the bearing surface 12, corresponding to the described four contact surfaces 8 at the kitchen appliance.

According to the slightly raised design of the area, in which the contact surfaces 8 of the kitchen appliance are arranged, the contact surfaces 13 of the data memory element 4 are arranged in an area, which is slightly countersunk as compared to the bearing surface 12. The countersunk area is formed in a groove-like manner. With regard to the dimensions, reference is also made to the above description of the rib-like elevation in the area of the partial outer surface 7 or of the outer surface of the kitchen appliance, respectively. A complementary design results in this regard.

In further detail, see FIGS. 6 to 8, the data memory element 4 is composed of a part, which is identified as lid part 14, in which the mentioned contact surfaces 13 and the bearing surface 12 are embodied, an annular part 15, a functional support part 16 and a bottom part 17. In the case of the exemplary embodiment, the electronic components, which are required for the operation and the use of the data memory element 4, are arranged on the functional support part 16, wherein a different arrangement or fastening is also possible within the data memory element 4. They are memory elements, in particular also a cryptographic memory, conductor elements and optionally, in a special embodiment, elements, which are required for the radio transmission of data, for instance according to the UMTS standard.

It can be seen from the illustration of FIG. 8, in which the parts, which are visible in FIG. 7, are illustrated diagonally from the bottom, that provision is also made in the lid part 14 for corresponding components, in particular conductor elements and printed circuit boards, for interacting with the electronic components, which are arranged in the functional support 16.

Magnets 11' or magentizable areas are also embodied in the data memory element 4, preferably in a "mirror-inverted" manner to an embodiment in the outer surface or partial outer surface of the kitchen appliance 1.

As a whole, the data memory element 4 is preferably embodied as flat part, comprising a bottom side and an upper side. A larges layout dimension of the bottom side or of the upper side, respectively, can preferably correspond to 1.5- times or more of a largest thickness of the data memory element 4. The second contact elements 13 are preferably arranged in the bottom side. In the case of a memory element, which is arranged at the kitchen appliance for the transmission of data, practically only the upper side is visible (see FIG. 3).

The visibility of the upper side can be clarified such that, at least based on a straight line of sight of a cone axis A, which extends vertically to a center plane E, is provided in a cone angle α of 60° or less. As can be seen, the center plane E extends at right angles to a thickness of the data memory element 4 and preferably parallel or nearly parallel to the upper side of the data memory element 4. Furthermore, the cone axis A preferably extends through the area center M of a layout of the data memory element.

While in the contact state, which is illustrated in FIG. 4, the data memory element 4 also has a handle part. The handle part is provided herein by the design of the data memory element 4 itself, namely in that, in detail, the bottom side U partially projects forwards beyond the surrounding outer surface 6 of the kitchen appliance 1 and transitions into a circumferential edge K, starting at which the upper side O extends. The data memory element 4 can then be removed from the kitchen appliance 1 again at the edge K, gripping with the fingers of a hand.

In absolute values, a distance u of the edge K across the surrounding outer surface 6 of the kitchen appliance 1 can be between 0.5 and 5 mm, for example.

The edge K is preferably provided due to the fact that the edge sections of the contour line of the data memory element, the cross section of which extend conically upwards or downwards in the edge area, respectively, meet. With reference to the center plane E, said edge is offset to the upper side O.

It is suggested in FIG. 9 that the data memory element 4 can also have one or a plurality of common USB interfaces 18, which project into the interior of the data memory element 4 in a hole-like manner. In the case of this embodiment, preferably only a common USB interface 18 is realized at the data memory element.

Such a USB interface 18 can in particular be formed starting at the upper side O or a side surface F. On principle, however, it can also be formed starting at the bottom side U.

Such a common USB interface 18 can be provided with a locking piece, which is not illustrated in detail, so as to avoid a contamination in response to common use, if possible. The locking piece can be embodied in a plug-like manner. It can also be provided so as to only be capable of being detached by means of a tool. For example, it can be screwed to the data memory element.

| REFERENCE LIST | | | |
|---|---|---|---|
| 1 | kitchen appliance | A | cone axis |
| 2 | mixing bowl | E | center plane |
| 3 | control panel | K | edge |
| 4 | data memory element | M | area center |
| 5 | housing | O | upper side |
| 6 | outer surface | U | bottom side |
| 7 | partial outer surface | F | side surface |
| 8 | contact element | u | distance |
| 9 | edge contour | x | transition area |
| 10 | bottom | α | cone angle |
| 11 | magnet | | |
| 11' | magnet | | |
| 12 | bearing surface | | |
| 13 | contact element | | |
| 14 | lid part | | |
| 15 | annular part | | |
| 16 | functional support part | | |
| 17 | bottom part | | |
| 18 | USB interface | | |

The invention claimed is:

1. An electrical appliance comprising:
an electric motor,
a housing, which has an outer surface,
a data memory element, and
a data transmission interface designed to interact with the data memory element, wherein the data transmission interface is formed in the outer surface of the housing by metal contact elements, which are arranged adjacent to each other and which each have a contact surface and form part of the outer surface, wherein, in the area of the data transmission interface, the outer surface of the housing is designed as a partial outer surface, which is offset towards the interior of the appliance, and wherein the metal contact elements rise beyond the plane of the partial outer surface by a measure, which corresponds to no more than the largest extension thereof, or less, or are shifted back by such a measure relative to the plane.

2. The appliance according to claim 1, wherein the data memory element has a non-volatile memory.

3. The appliance according to claim 1, wherein the data memory element has a cryptographic memory.

4. The appliance according to claim 1, wherein the data transmission interface comprises a standard universal serial bus interface in addition to the metal contact elements.

5. The appliance according to claim 1, wherein provision is made for three or more common contact elements.

6. The appliance according to claim 1, wherein the metal contact elements are arranged along a straight line.

7. The appliance according to claim 1, wherein the appliance is a kitchen appliance further comprising a mixing vessel and an agitator within the mixing vessel.

8. The appliance according to claim 7, wherein the partial outer surface is closed in a depth direction towards an interior of the kitchen appliance so as not to have any apertures, openings, or depressions towards the interior of the kitchen appliance, and wherein the contact surfaces are embodied in a surrounding bearing surface having essentially the same height as the contact surfaces.

9. The appliance according to claim 8,
wherein the partial outer surface has an area center and wherein the metal contact elements are arranged outside of the area center.

10. The appliance according to claim 8, wherein provision is made for at least one magnet located in the partial outer surface.

11. The appliance according to claim 10, wherein a magnet is provided laterally offset to a metal contact element.

12. The appliance according to claim 10, wherein a magnet is invisible from outside.

13. The appliance according to claim 10, wherein provision is made for two magnets.

14. The appliance according to claim 13, wherein a distance between the magnets is larger than a distance between two outermost metal contact elements, which are arranged adjacent to each other.

15. The appliance according to claim 10, wherein a magnet is arranged below the partial outer surface.

16. The appliance according to claim 8, wherein the metal contact elements extend in the plane of the partial outer surface.

17. The appliance according to claim 8,
wherein the partial outer surface has a layout contour, which has curves,
wherein the layout contour is circular or the layout contour is oval.

18. The appliance according to claim 8,
wherein the partial outer surface has a layout contour, which has curves,
wherein a largest extension of the layout contour is between 1 and 10 cm.

19. The appliance according to claim 8, wherein provision is made in the partial outer surface for at least one magnetizable area.

20. The appliance according to claim 8, wherein the metal contact elements are combined in an elevated rib on a bottom of the partial outer surface.

* * * * *